United States Patent [19]

Shikakura

[11] Patent Number: 5,687,182
[45] Date of Patent: Nov. 11, 1997

[54] ERROR DETECTION AND CORRECTION DEVICE

[75] Inventor: Akihiro Shikakura, Kawasaki, Japan

[73] Assignee: Canon Kabushiki Kaisha, Tokyo, Japan

[21] Appl. No.: 355,986

[22] Filed: Dec. 14, 1994

Related U.S. Application Data

[63] Continuation of Ser. No. 34,219, Mar. 19, 1993, abandoned, which is a continuation of Ser. No. 533,788, Jun. 6, 1990, abandoned.

[30] Foreign Application Priority Data

Jun. 7, 1989 [JP] Japan ................. 1-144530

[51] Int. Cl.⁶ ................................................ H03N 13/00
[52] U.S. Cl. ........................ 371/41; 371/5.1; 371/37.7
[58] Field of Search .............. 371/41, 5.5, 37.4, 371/5.1, 37.2, 37.3, 37.5, 37.7

[56] References Cited

U.S. PATENT DOCUMENTS

| | | | |
|---|---|---|---|
| 3,078,443 | 2/1963 | Rose | 371/41 |
| 3,638,182 | 1/1972 | Burton et al. | 371/37.4 |
| 4,477,903 | 10/1984 | Immink et al. | 371/37.4 |
| 4,541,091 | 9/1985 | Nishida et al. | 371/39 |
| 4,593,395 | 6/1986 | Immink et al. | 371/37.4 |
| 4,742,519 | 5/1988 | Abe et al. | 360/38.1 |
| 4,953,019 | 8/1990 | Shikakura et al. | 358/133 |
| 4,979,174 | 12/1990 | Cheng et al. | 371/41 |

FOREIGN PATENT DOCUMENTS

| | | |
|---|---|---|
| 102782 | 3/1984 | European Pat. Off. . |
| 0136604 | 4/1985 | European Pat. Off. . |
| 59-200547 | 11/1984 | Japan . |
| 59-228440 | 12/1984 | Japan . |

OTHER PUBLICATIONS

"The SMPTE type D-1 digital television tape recorder-Error control," SMPTE Journal, Wilkinson, vol. 95, No. 11, Nov. 1986, pp. 1144-1149.

*Primary Examiner*—Robert W. Beausoliel, Jr.
*Assistant Examiner*—Dieu-Minh Le
*Attorney, Agent, or Firm*—Fitzpatrick, Cella, Harper & Scinto

[57] ABSTRACT

An error detection and correction device in which a word train including a number of error correction codes each constructed from a plurality of words is input, the error correction code being of the type that two error words can be corrected by each error correction code. Error words are corrected by using the error correction code within the word train. Mode setting information associated with an error rate of the word train is generated, and an error correction means is controlled in a first or a second error correction mode depending on the mode setting. The error correction means corrects one or two error words for each error correction code in the first error correction mode and corrects only one error word for each error correction code in the second error correction mode.

13 Claims, 5 Drawing Sheets

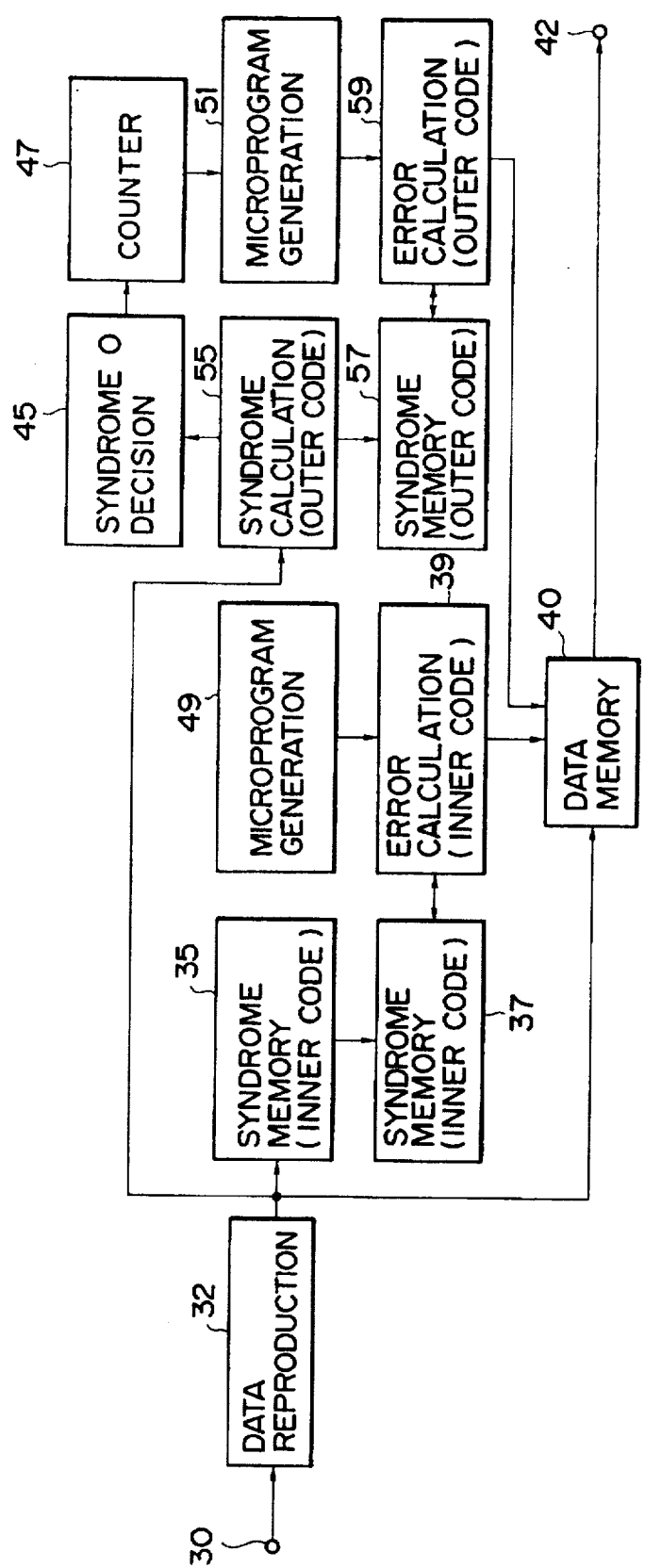
F I G. 5

ERROR DETECTION AND CORRECTION DEVICE

This application is a continuation of application Ser. No. 08/034,219 filed Mar. 19, 1993, ABD, which is a continuation of application Ser. No. 07/533,788 filed Jun. 6, 1990, now abandoned.

BACKGROUND OF THE INVENTION

1. Field of the Invention

The present invention relates to an error detection and correction circuit, and more particularly to a circuit for detecting and correcting an error of a code train transmitted via a transmission path such as a magnetic recording/reproducing system.

2. Related Background Art

In a recording/reproducing system for digital data (code train), i.e., in a data transmission system, error detection and correction codes are generally used for correcting an error generated during the data transmission. FIG. 1 is a block diagram showing an example of the circuit arrangement of a conventional error detection and correction circuit. Digital data (word train) is input to an input terminal 10, the digital data having been error-correction coded at the recording (or transmitting) side and passed through a transmission system and may include a transmission error. A data reproduction circuit 12 causes the input data at the input terminal 10 to be subjected to demodulation, synchronous separation, ID recognition, and other processes to thereby reproduce each data (word) and output the reproduced data. This reproduced data (code train) is directly written in a data memory 20 in accordance with the recognized ID information, and is also applied to a syndrome calculation circuit 14 for error correction.

In accordance with a known manner, the syndrome calculation circuit 14 executes a syndrome calculation for each error correction code constructed from a plurality of transmission words, and sequentially writes a plurality of syndromes for each error correction code into a syndrome memory 16. An error position and error pattern calculation circuit 18 reads syndromes written in the syndrome memory 16 and decodes the error correction code. The circuit 18 may be constructed of a general arithmetic operation processing circuit, and the operation thereof is controlled by a microprogram 19. If an error is detected and it is judged that the error is correctable, then the error position and error pattern are calculated, and using the calculated results the data (code) in the data memory 20 is corrected. If it is judged that the error is not correctable, the corresponding data (code) in the data memory 20 is maintained unchanged, and a correction flag indicative of a presence of an error is entered in the data memory 20 while performing other necessary processes.

After the above operations, the error-corrected data (codes) in the data memory 20 is outputted from an output terminal 22.

In the conventional circuit described above, if digital data to be processed is image data, uncorrectable data can be corrected by means of interpolation at a high probability. In such a case, the quality of image is deteriorated by a large probability of error correction rather than by a large probability of uncorrectable error and interpolation. Namely, the degree of deterioration of the image quality is greater upon occurrence of error correction.

With the advent of a recent transmission path having a large change in transmission error rate such as in the case of a satellite broadcasting system whose error rate depends on weather conditions, there has been highly desired a way to improve image quality under bad weather conditions. One way to solve this is to enhance the error correction capability of the transmission system to the extent that it can support the worst case. However, this solution is not practical because large cost and facilities are required for such an enhanced error correction capability.

SUMMARY OF THE INVENTION

It is an object of the present invention to solve the above problems.

It is another object of the present invention to provide an error detection and correction device capable of obtaining an optimum reproduced word train irrespective of a change in the reliability of a transmission line.

With the above objects in view, according to one aspect of the present invention, there is provided an error detection and correction device, comprising:

(a) input means for inputting via a transmission path a code train including a number of error correction codes each constructed of a plurality of codes;

(b) detection means for detecting an error code rate of said code train inputted from said input means;

(c) error correction means for correcting an error code by using said error correction code within said code train; and (d) selection means responsive to an output from said detection means for selecting as the operation mode of said error correction means one of a plurality of modes including first and second modes having a different error correction capability.

The above and other objects and advantages of the present invention will become apparent from the following detailed description of the preferred embodiments.

BRIEF DESCRIPTION OF THE DRAWINGS

FIG. 5 is a block diagram showing an example of the arrangement of an error correction circuit according to a further embodiment of this invention.

DETAILED DESCRIPTION OF PREFERRED EMBODIMENTS

The embodiments of this invention will be described with reference to the accompanying drawings.

Figure 1:
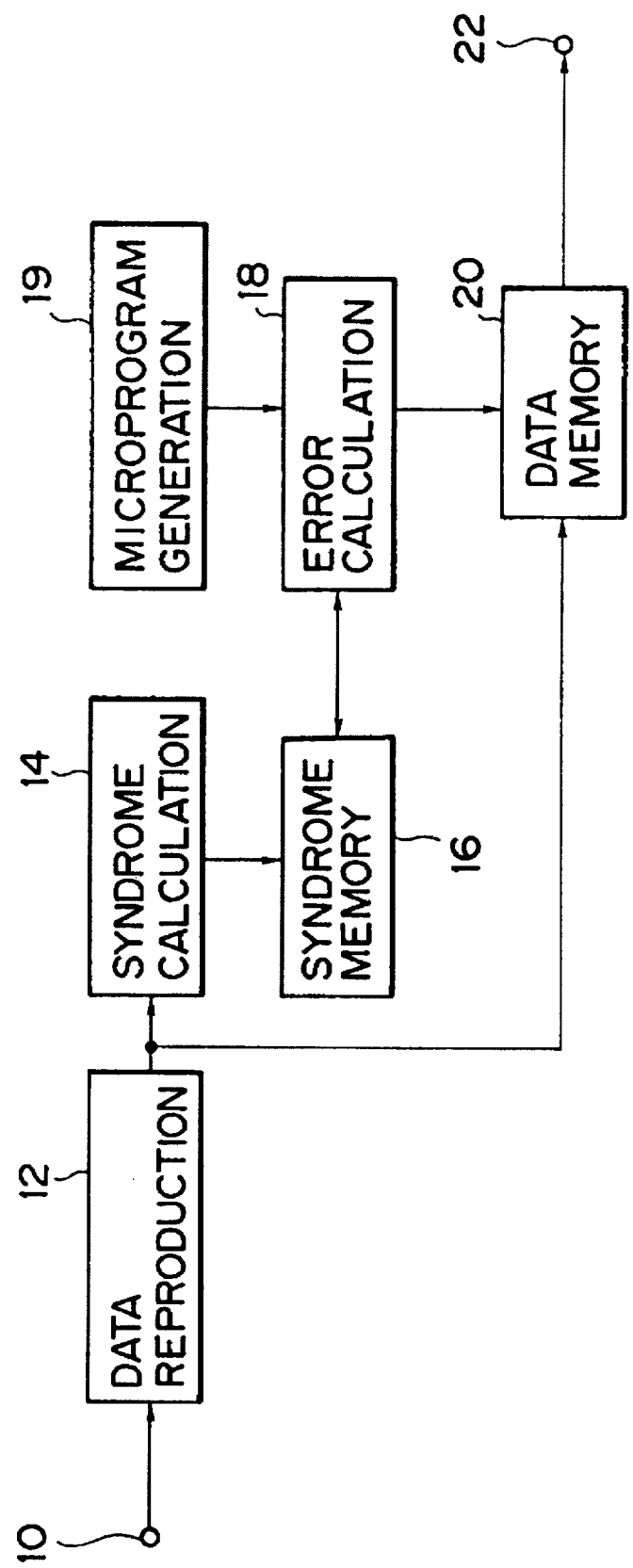
FIG. 1 is a block diagram showing an example of the arrangement of a conventional error correction circuit.
Figure 2:
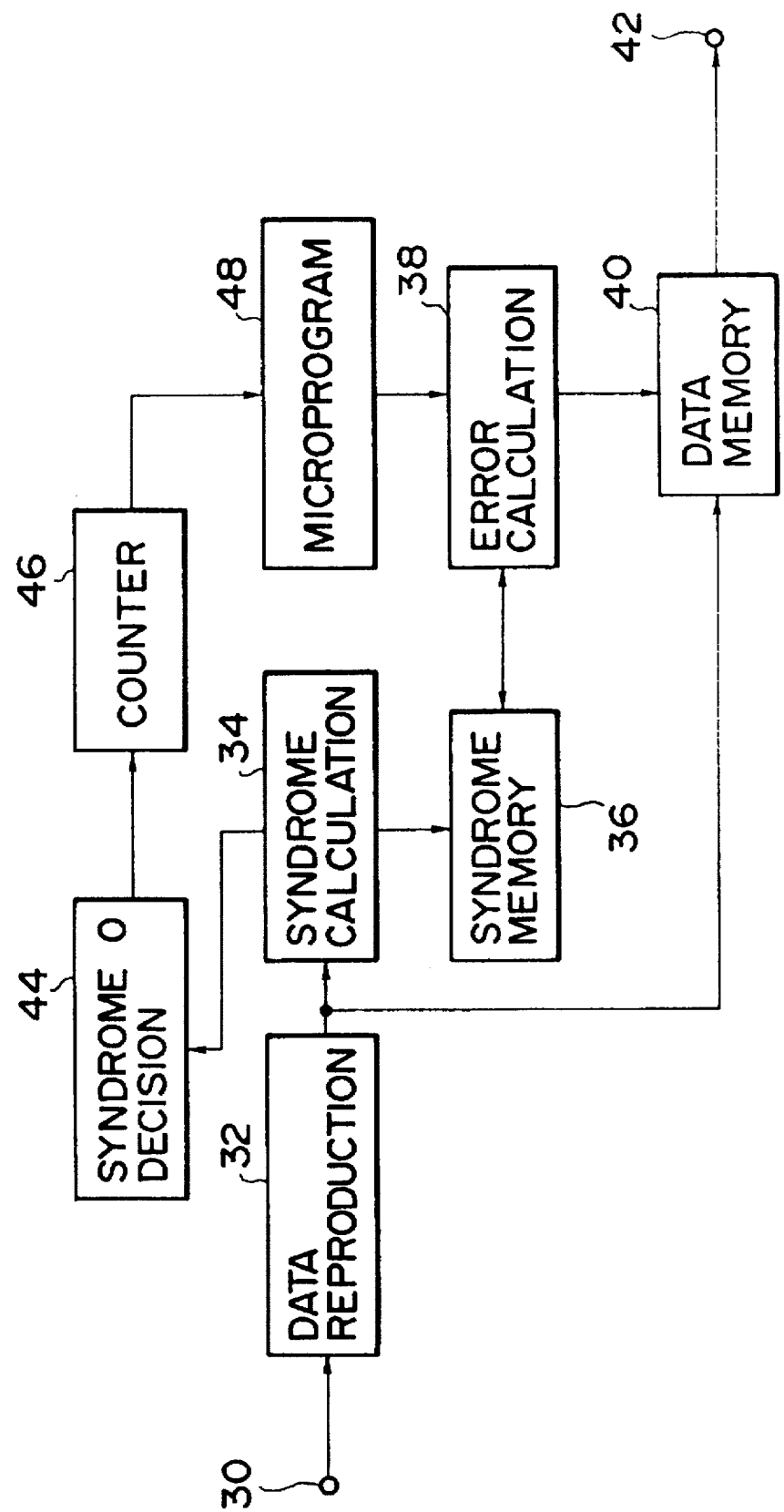
FIG. 2 is a block diagram showing an example of the arrangement of an error correction circuit according to an embodiment of this invention.

FIG. 2 is a block diagram showing the arrangement of the error correction circuit according to the embodiment of this invention. Similar to the input terminal 10, digital data (word train) is input to an input terminal 30, the digital data having passed through a transmission path may include a transmission error. A data reproduction circuit 32 causes the input data at the input terminal 30 to be subjected to demodulation, synchronous separation, ID recognition, and other processes to thereby reproduce each data (word) and output the reproduced data. This reproduced data is directly written in a data memory 20 in accordance with the recognized ID information, and is also applied to a syndrome calculation circuit 34 for error correction. In accordance with a known manner, the syndrome calculation circuit 34 executes a syndrome calculation for each error correction code constructed from a plurality of transmission words, and sequentially writes a plurality of syndromes for each error correction code into a syndrome memory 36.

The calculation results obtained by the syndrome calculation circuit 34 are also supplied to a syndrome 0 detection circuit 44. This circuit 44 judges whether the plurality of syndromes for each error correction code are all 0 or not. From the output of the syndrome 0 decision circuit 44, a counter 46 counts the number of error correction codes whose syndrome are not all 0, i.e., counts during a predetermined time duration the number of error correction codes having an error. The count value of the counter 46 at the predetermined time duration corresponds to the information representative of the transmission error rate. In accordance with this error rate information, the counter 46 generates and outputs a mode selection signal for selecting an error correction algorithm to be described later. As a simplified example of the mode selection signal, it uses one bit information which takes a value 1 for the transmission error rate equal to or larger than a predetermined value, and 0 for the transmission error rate smaller than the predetermined value.

An error position and error pattern calculation circuit 38 is constructed of a general arithmetic operation processing circuit, and is controlled by a microprogram generator 48. As will be described later, the microprogram generator 48 is provided with a pluralty of program modules each having a different decoding algorithm. The error position and error pattern calculation circuit 38 is controlled by a module selected by a mode selection signal supplied from the counter 46. Specifically, the circuit 38 executes an error correction suitable for reproducing image data with less image deterioration, by using the optimum decoding algorithm for the current transmission error rate.

A more particular description will be given in the following. It is assumed now that the current error correction code is a two error correctable code, and that two types of decoding modes for different transmission error rates have been set in the microprogram generator 48. In the normal mode while the error rate is low, i.e., while each error correction code has one or two error words, the error position and error pattern calculation circuit 38 executes an error correction process, and executes not an error correction process but an uncorrectable error process if three or more error words are generated. The error correction process means to calculate the error position and error pattern, and by using the calculated results, correct the error word in the data memory 40. The uncorrectable error process means to judge the error as uncorrectable, maintain unchanged the corresponding error correction code in the data memory 40, enter a correction flag indicative of a presence of an error in the data memory, and perform other necessary processes.

If the transmission error rate becomes bad and the count value of the counter 46 exceeds the predetermined threshold value, the microprogram generator 48 selects a program module for a specific mode in accordance with a mode selection signal supplied thereto. For example, an error correcting process is executed only if there is one error word in each error correction code, and an uncorrectable error process is executed if there are two error words or more.

Figure 3:
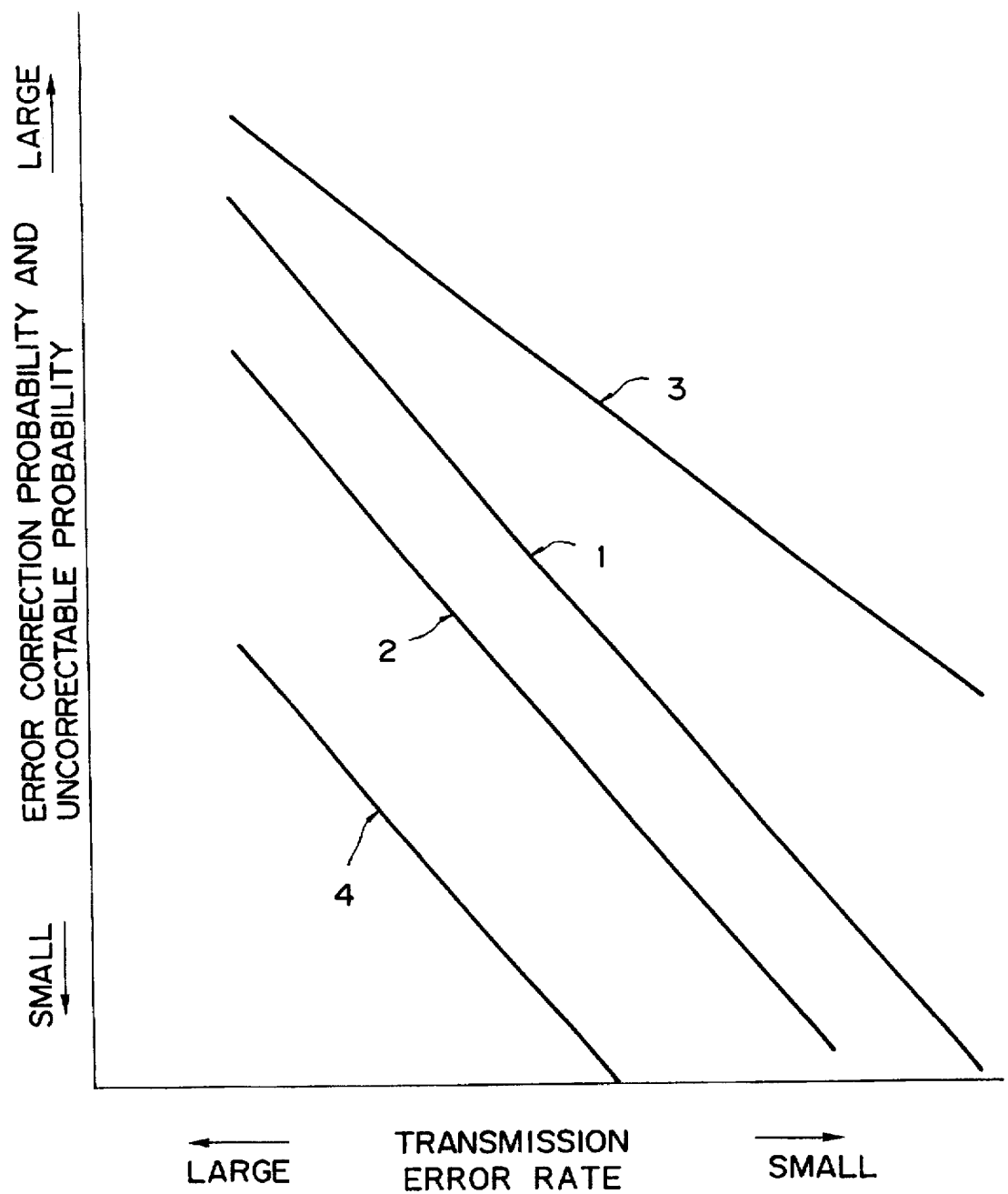
FIG. 3 is a diagram showing the uncorrectable probability and error correction probability in each error correction mode.

Example of the decoding error rate characteristics for the normal mode and for the specific mode used with a bad error rate are shown in FIG. 3. A line 1 indicates the uncorrectable probability during the normal mode, i.e., during a mode for correcting up to two error words, a line 2 indicates the error correction probability during the normal mode, a line B indicates the uncorrectable probability during the specific mode used with a bad error rate, i.e., during a mode for correcting only one error word, and a line 4 indicates the error correction probability during the specific mode. As compared with the normal mode, during the specific mode, although the uncorrectable probability increases, i.e., becomes bad, the error correction probability becomes small. Accordingly, by using the normal mode while the error rate is small and the specific mode while it is large, the error correction probability can be restricted within an allowable range except a considerably large error rate.

The error position and error pattern calculation circuit 38 reads syndromes written in the syndrome memory 36 to execute a decoding process for the error correction code. If all syndromes for the corresponding error correction code are 0, it is judged that there is no error to thereby terminate the processing for that code. On the other hand, if all syndromes are not 0, there is an error and if the error is judged as correctable, the circuit 38 calculates the error position and error pattern, and using the calculated results, and the code stored in the data memory is corrected. If the error is judged as uncorrectable, the corresponding code in the data memory is remained unchanged, a flag indicative of a presence of an error is entered in the data memory 40, and other necessary processes are executed.

For data such as image data which can be effectively corrected even if they are regarded uncorrectable, it is desirable, as described previously, to make small the number of interpolations and make small the number of error corrections from the standpoint of signal quality (image quality). The embodiment therefore allows for the reproduction of image data with less image quality deterioration. During the specific mode with a bad error rate, the error correction process may not be executed and only the error detection process may be executed, with the similar advantageous effects being obtained.

In the above embodiment, a code capable of two errors detection and two errors correction has been described by way of example. It is obvious that the present invention is not limited thereto. Also the number of modes which can be set by the microprogram generator 48 is not limited to two.

As readily appreciated from the foregoing description of this embodiment, use of an additional simple circuit can make small the error probability. If a code capable of effectively executing an interpolation process is used such as in video data, it can be processed with the advantageous effects of making small the quality deterioration of a reproduced image.

Figure 4:
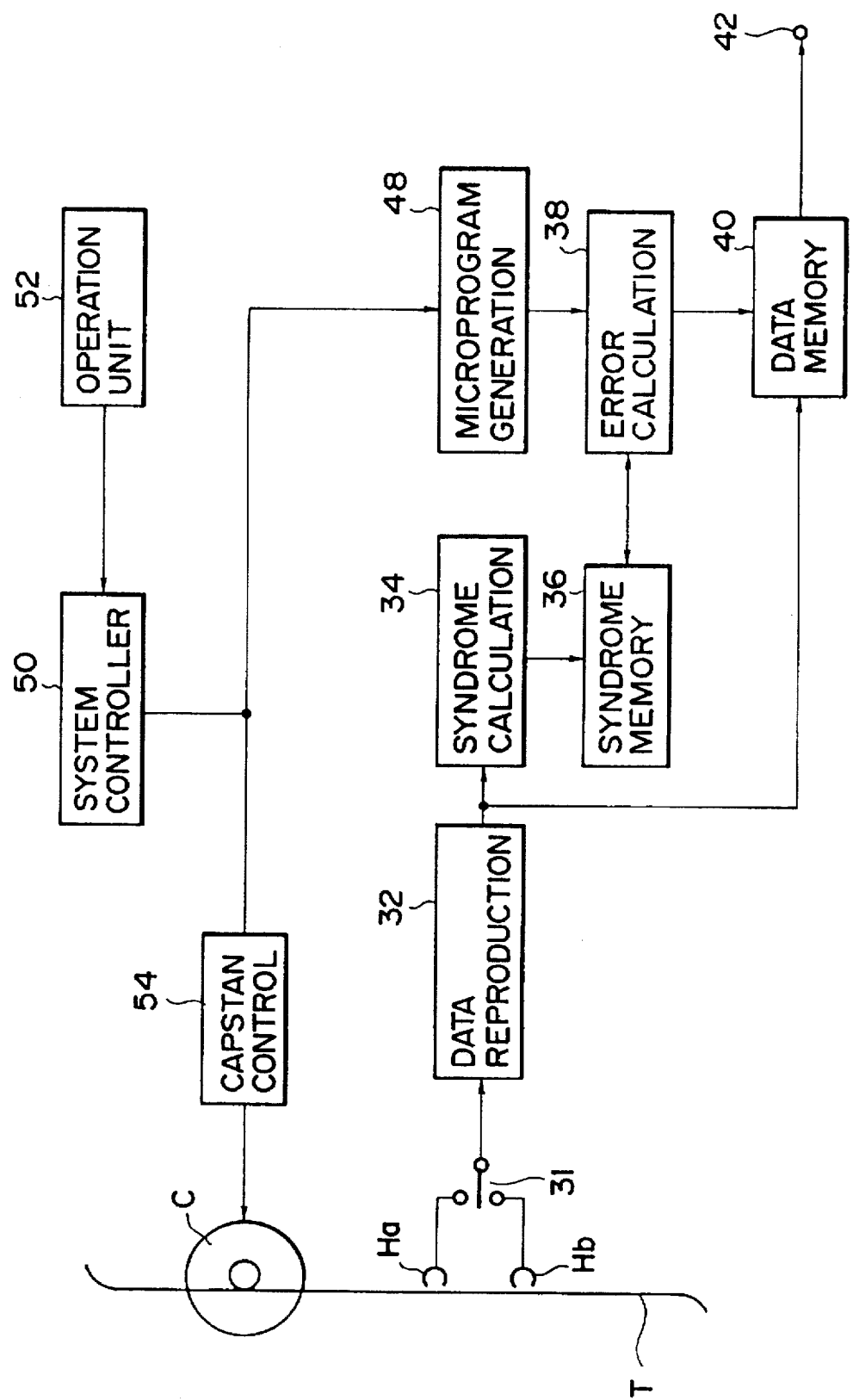
FIG. 4 is a block diagram showing an example of the arrangement of an error correction circuit according to another embodiment of this invention.

FIG. 4 is a block diagram showing the arrangement of an error detection and correction device according to another embodiment of this invention. Like elements to those shown in FIG. 2 are represented by identical reference numerals, and the description therefor is omitted.

In this embodiment, the present invention is applied to a digital VTR having a transmission path of a magnetic recording and reproducing system. In FIG. 4, T represents a magnetic tape, and Ha and Hb represent a rotary magnetic head. The rotary magnetic heads Ha and Hb alternately trace the magnetic tape T and alternately output a reproduced signal. A switch 31 selects the outputs of the heads Ha and Hb, and supplies it as the reproduced data (code train) to a data reproduction circuit 32.

The VTR of this embodiment has two modes, one being the normal reproduction mode for running the magnetic tape T at the same speed as that during the recording, and the other being the specific reproduction mode for running the magnetic tape T at the speed different from that during the recording. These reproduction modes are selected by an operator from an operation unit 52. In accordance with an instruction from the operation unit 52, a system controller 50 outputs a mode setting signal to control the circuits of the device. Specifically, the system controller 50 supplies the mode setting signal to a capstan controller 54 to control a capstan C so that during the normal reproduction mode magnetic tape T is caused to run at the same speed as that during the recording, whereas during the specific reproduction mode, it is caused to run at a preset speed different from that during the recording. The system controller 50 supplies the mode setting signal also to a microprogram generator 48 which selects a program for the normal mode during the normal reproduction mode, and a program for the specific mode during the specific reproduction mode.

During the normal reproduction mode, an error correction process is executed if there are two or less error words, and an uncorrectable process is executed if there are three of more error words. During the specific reproduction mode, an error correction process is executed if there is one error word, and an uncorrectable process if there are three or more error words.

In general, during the normal reproduction mode, the tracing loci of the rotary heads Ha and Hb are generally parallel with the recorded helical track and the tracking control is executed. Therefore, there seldom occurs a high error rate of a reproduced word train from the switch 31. On the other hand, during the specific reproduction mode, the tracing loci of the rotary heads Ha and Hb intersect with the recorded helical track so that the error rate of a reproduced word train becomes high. In view of this, according to this embodiment, a normal error correction is executed during the normal reproduction mode, and an error correction capability is lowered during the specific reproduction mode to thereby make the error correction probability equal to or lower than a predetermined value.

The embodiment device shown in FIG. 4 has similar advantageous effects to the embodiment shown in FIG. 2. In addition, the embodiment device applied to a reproducing system can make the circuit for switching between the normal mode and specific mode considerably simple, as compared with the embodiment shown in FIG. 2.

FIG. 5 is a block diagram showing the arrangement of an error detection and correction device according to a still further embodiment of this invention. Like elements to those shown in FIG. 2 are represented by identical reference numerals, and the detailed description therefor is omitted.

The embodiment shown in FIG. 5 assumes to use as the correction coding system a so-called chain coding system which has as the error correction code so-called inner and outer codes. Reference numeral 35 represents a syndrome calculation circuit for an inner code, 37 a syndrome memory for an inner code, 39 an error calculation circuit for an inner code, 49 a microprogram generator for an inner code. These circuits perform, for an inner code, similar operations to those of the circuits 34, 36, 38 and 48 shown in FIG. 2. Reference numeral 55 represents a syndrome calculation circuit for an outer code, 57 a syndrome memory for an outer code, 59 an error calculation circuit for an outer code, and 51 a microprogram generator for an outer code. These circuits perform, for an outer code, similar operations to those of the circuits 34, 36, 38 and 48 shown in FIG. 2.

In this embodiment, the microprogram generator 49 for an inner code is always set at a normal mode. The results calculated by the syndrome calculation circuit 55 for an outer code are supplied to a syndrome 0 decision circuit 45 to decide whether or not all of a plurality of syndromes for each outer code are 0. A counter 47, similar to the counter 46 shown in FIG. 2, causes the microprogram generator 51 for an outer code to select a program module which performs an error correction process if there are two or less error words and performs an uncorrectable process if there are three or more error words, respectively when the number of outer codes with error is equal to or smaller than a predetermined threshold value during a predetermined time duration. The counter also causes the microprogram generator 51 for an outer code to select a program module which always performs not an error correction process but an uncorrectable process when the number of outer codes with error exceeds the predetermined threshold value.

With the above circuit arrangement, a sufficient error correction is executed if the error code rate is low, and prevents the error correction process for an outer code from being executed if the error word rate is high. Namely, if the error rate is high, the error correction capability is lowered as a whole to restrict the occurrence or error corrections equal to or lower than a predetermined value, to thereby prevent large deterioration of the reproduced data (word train).

In the embodiment shown in FIG. 5, if the number of outer codes with error during the predetermined time duration exceeds the predetermined threshold value, the microprogram generator 51 for an outer code does not execute an error correction process by all means and selects a program module for executing an uncorrectable process. However, similar advantageous effects can also be obtained by selecting a program module which executes an error correction process only when there is one error word and executes an uncorrectable process when there are two or more error words.

What is claimed is:

1. An error detection and correction device, comprising:
   input means for inputting via a transmission path a word train including a number of error correction codes each constructed from a plurality of words, the error correction codes being of such a type that "i" number of error words can be corrected by each error correction code;
   error detection and correction means for detecting and correcting error words by using the error correction codes;
   generation means for generating mode setting information associated with an error rate of the word train; and
   control means responsive to the mode setting information for controlling an operation of said error correction means using each of the error correction codes in a first or a second mode such that, in the first mode, error words are corrected by using each of the error correction codes when at most "i" number of error words are detected and no error words are corrected when at least "i+1" number of error words are detected, and that, in the second mode, error words are corrected by using each of the error correction codes when at most "j" number of error words are detected and no error words are corrected when at least "j+1" number of error words are detected, "i" and "j" being integers (i>j≧1).

2. A device according to claim 1, wherein said control means controls said error correction means in the second mode if the mode setting information indicates a relatively high error rate, and said control means controls said error correction means in the first mode if the mode setting information indicates a relatively low error rate.

3. A device according to claim 1, wherein said generation means includes a detection circuit which detects a presence or absence of an error word in each error correction code in accordance with the plurality of syndromes for each error correction code.

4. A device according to claim 3, wherein said detection circuit determines that there is no error when all of the plurality of syndromes are zero.

5. A device according to claim 3, wherein said generation means includes a counter circuit which counts the number of error correction codes with an error word during a predetermined time duration by using a detection output from said detection circuit.

6. A device according to claim 1, wherein said input means includes a reproduction head for reproducing the word train from a number of helical tracks formed on a tape recording medium.

7. A device according to claim 6, further comprising:

feeding means for feeding the tape recording medium, said feeding means selecting as a feeding speed of the tape recording medium one of a plurality of speeds including first and second speeds, in accordance with the mode setting information from said generation means, wherein when the tape recording medium is fed at the first speed, said reproduction head traces the tape recording medium substantially in parallel with the longitudinal direction of the helical tracks, and when the tape recording medium is fed at the second speed, said reproduction head traces the tape recording medium in a direction intersecting the longitudinal direction of the helical track.

8. A device according to claim 7, wherein said control means controls said error correction means in the first mode when said feeding means feeds the tape recording medium at the first speed, and in the second mode when said feeding means feeds the tape recording medium at the second speed.

9. An error detection and correction device, comprising:

input means for inputting via a transmission path a word train including a number of error correction codes each constructed from a plurality of words;

detection means for detecting an error word rate of the word train input from said input means;

error detection and correction means for detecting and correcting error words by using the error correction codes; and control means responsive to an output from said detection means for controlling an operation of said error correction means using each of the error correction codes in a first or a second mode such that, in the first mode, error words are corrected by using each of the error correction codes when at most "i" number of error words are detected and no error words are corrected when at least "i+1" number of error words are detected, and that, in the second mode, error words are corrected by using each of the error correction codes when at most "j" number of error words are detected and no error words are corrected when at least "i+1" number of error words are detected, "i" and "j" being integers (i>j≧1).

10. A device according to claim 9, wherein said detection means includes a detection circuit which detects a presence or absence of an error word in each error correction code in accordance with a plurality of syndromes for each error correction code.

11. A device according to claim 10, wherein said detection circuit determines that there is no error when all of the plurality of syndromes are zero.

12. An error detection and correction device, comprising:

input means for inputting via a transmission path a word train including a number of error correction codes each constructed from a plurality of words, the error correction codes being of such a type that "i" number of error words can be corrected by each error correction code;

error detection and correction means for detecting and correcting error words by using the error correction codes; and mode setting means for setting a mode of the device among a plurality of modes including a first mode in which error words are corrected by using each of the error correction codes when at most "i" number of error words are detected and no error words are corrected when at least "i+1" number of error words are detected, and a second mode in which words are corrected by using each of the error correction codes when at most "j" number of error words are detected, "i" and "j" being integers (i>j≧1).

13. A device according to claim 12, wherein said input means includes a reproducing head for reproducing the word train from a number of helical tracks formed on a tape-shaped recording medium.

\* \* \* \* \*

UNITED STATES PATENT AND TRADEMARK OFFICE
CERTIFICATE OF CORRECTION

PATENT NO. : 5,687,182

DATED : November 11, 1997

INVENTOR(S): AKIHIRO SHIKAKURA

It is certified that error appears in the above-identified patent and that said Letters Patent is hereby corrected as shown below:

<u>COLUMN 5</u>

Line 1, "it" should read --them--.

<u>COLUMN 8</u>

Line 14, ""i+1"" should read --"j+1"--.

Signed and Sealed this

Tenth Day of November 1998

Attest:

BRUCE LEHMAN

Attesting Officer     Commissioner of Patents and Trademarks